(12) United States Patent
Plettner et al.

(10) Patent No.: US 10,211,021 B2
(45) Date of Patent: Feb. 19, 2019

(54) PERMANENT-MAGNET PARTICLE BEAM APPARATUS AND METHOD INCORPORATING A NON-MAGNETIC METAL PORTION FOR TUNABILITY

(71) Applicant: KLA-Tencor Corporation, Milpitas, CA (US)

(72) Inventors: Tomas Plettner, San Ramon, CA (US); John David Gerling, Livermore, CA (US); Mohammed Tahmassebpur, San Ramon, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 58 days.

(21) Appl. No.: 15/429,071

(22) Filed: Feb. 9, 2017

(65) Prior Publication Data
US 2017/0294286 A1 Oct. 12, 2017

Related U.S. Application Data

(60) Provisional application No. 62/321,077, filed on Apr. 11, 2016.

(51) Int. Cl.
*H01J 29/68* (2006.01)

(52) U.S. Cl.
CPC ......... *H01J 29/68* (2013.01); *H01J 2229/703* (2013.01)

(58) Field of Classification Search
CPC .. H01J 37/00; H01J 37/02; H01J 37/10; H01J 37/14; H01J 37/143; H01J 3/20; H01J 3/24; H01J 29/64; H01J 29/68; H01J 2229/5682

USPC .............................. 250/396 R, 397, 396 ML
See application file for complete search history.

(56) References Cited

U.S. PATENT DOCUMENTS

| | | | |
|---|---|---|---|
| 3,178,602 | A | 4/1965 | Meixner |
| 3,181,042 | A | 4/1965 | Rolf |
| 4,315,152 | A | 2/1982 | Smith |
| | | (Continued) | |

FOREIGN PATENT DOCUMENTS

| | | |
|---|---|---|
| JP | H01296549 A | 11/1989 |
| JP | 2000090866 A | 3/2000 |
| JP | 2014194923 A | 10/2014 |

OTHER PUBLICATIONS

Nirkko et al., "An adjustable focusing system for a 2 MeV H-ion beam line based on permanent magnet quadrupoles," Journal of Insrumentation, vol. 8, Feb. 2013, pp. 1-17.

(Continued)

*Primary Examiner* — Nicole Ippolito
(74) *Attorney, Agent, or Firm* — Zilka-Kotab, PC

(57) ABSTRACT

A permanent-magnet particle beam apparatus and method incorporating a non-magnetic portion for tunability are provided. The permanent-magnet particle beam apparatus includes a particle beam emitter that emits a charged particle beam, and includes a set of permanent magnets forming a magnetic field for controlling condensing of the charged particle beam. The permanent-magnet particle beam apparatus further includes a non-magnetic electrical conductor component situated with the set of permanent magnets to control a kinetic energy of the charged particle beam moving through the magnetic field.

18 Claims, 5 Drawing Sheets

(56) References Cited

U.S. PATENT DOCUMENTS

| | | | |
|---|---|---|---|
| 4,712,012 A * | 12/1987 | Naylor | H01J 27/028 |
| | | | 250/423 R |
| 5,324,950 A | 6/1994 | Otaka et al. | |
| 5,612,535 A | 3/1997 | Wang | |
| 6,057,553 A | 5/2000 | Khursheed et al. | |
| 6,307,312 B1 | 10/2001 | Tanaka | |
| 7,075,092 B2 | 7/2006 | Winkler et al. | |
| 7,663,327 B2 | 2/2010 | Bhatt et al. | |
| 8,455,838 B2 | 6/2013 | Shadman et al. | |
| 8,513,619 B1 | 8/2013 | Nasser-Ghodsi et al. | |
| 8,698,094 B1 | 4/2014 | Sears et al. | |
| 2005/0236568 A1 * | 10/2005 | Buijsse | H01J 37/143 |
| | | | 250/310 |
| 2006/0197030 A1 | 9/2006 | Buijsse et al. | |
| 2010/0230590 A1 | 9/2010 | Bierhoff et al. | |

OTHER PUBLICATIONS

International Search Report and Written Opinion from PCT Application No. PCT/US2017/026438, dated Jun. 21, 2017.

\* cited by examiner

PERMANENT-MAGNET PARTICLE BEAM APPARATUS AND METHOD INCORPORATING A NON-MAGNETIC METAL PORTION FOR TUNABILITY

RELATED APPLICATION(S)

This application claims the benefit of U.S. Provisional Patent Application No. 62/321,077 filed Apr. 11, 2016, the entire contents of which are incorporated herein by reference.

FIELD OF THE INVENTION

The present invention relates to charged particle beam devices, and more particularly to particle beam devices that include permanent magnets.

BACKGROUND

Particle beam devices are a class of electrical devices that emit a particle beam for various purposes. In the case of electron beams, the particular beam device may be an electron gun/emitter. While the disadvantages of existing electron guns are described below, it should be noted that these disadvantages equally apply to other types of particular beam devices (e.g. positively or negatively charged ion beams).

In the case of electron guns, these devices typically operate to produce a controlled electron beam, namely by accelerating and/or focusing (condensing) the electron beam. In some basic implementations, electron guns are configured with permanent magnets to control the electron beam. The magnets are permanently situated within the electron gun housing to shape a magnetic field which controls the electron beam.

To the author's knowledge all electron guns have a dedicated extractor electrode that controls the electric field in the emitter region. FIG. 1 shows one example of a configuration of a permanent-magnet electron gun having an extractor for control of emission current, in accordance with the prior art. As shown, FIG. 1 includes an extractor 107A, 107B situated near the electron emitter 102. The extractor 107A, 107B accelerates the electron beam 106 emitted by the electron emitter 102 at an opening thereof and then directs the electron beam 106 through a smaller opening towards the permanent magnets 104A, 104B. This permanent magnet element 104A, 104B provides a magnetic lens that condenses the electron beam 106. A more detailed description of this type of permanent-magnet electron gun is described in U.S. Pat. No. 8,513,619 to Nasser-Ghodsi et al., filed May 10, 2012 and entitled "Non-planar extractor structure for electron source." Most ideally the extractor controls the emission without impacting the condensing caused by the permanent magnet lens. However, in an actual implementation of the prior art (such as U.S. Pat. No. 8,513,619 to Nasser-Ghodsi et al.) the extractor impacts both emission and condensing of the electron gun, making its operation difficult. Furthermore, the extractor shown therein has a deep well that can be difficult to fabricate, presents a trapped volume and poor local vacuum at the emitter location.

One solution that helps address the shortcoming in control of condensing from permanent-magnet electron guns is the deployment of a magnetic coil instead of permanent magnets. The coil enables a tunable magnetic field, but unfortunately it requires electrical power to generate the magnetic field. This in turn requires the electron gun housing to be larger than the permanent-magnet counterparts, such as that described above, in order to account for the coil and power supply connection.

There is thus a need for addressing these and/or other issues associated with the prior art permanent-magnet based charged particle gun devices.

SUMMARY

A permanent-magnet particle beam apparatus and method incorporating a non-magnetic portion for tunability are provided. The permanent-magnet particle beam apparatus includes a particle beam emitter that emits a charged particle beam, and includes a set of permanent magnets forming a magnetic field for controlling condensing of the charged particle beam. The permanent-magnet particle beam apparatus further includes a non-magnetic electrical conductor component situated with the set of permanent magnets to control a kinetic energy of the charged particle beam moving through the magnetic field.

DETAILED DESCRIPTION

Figure 2:
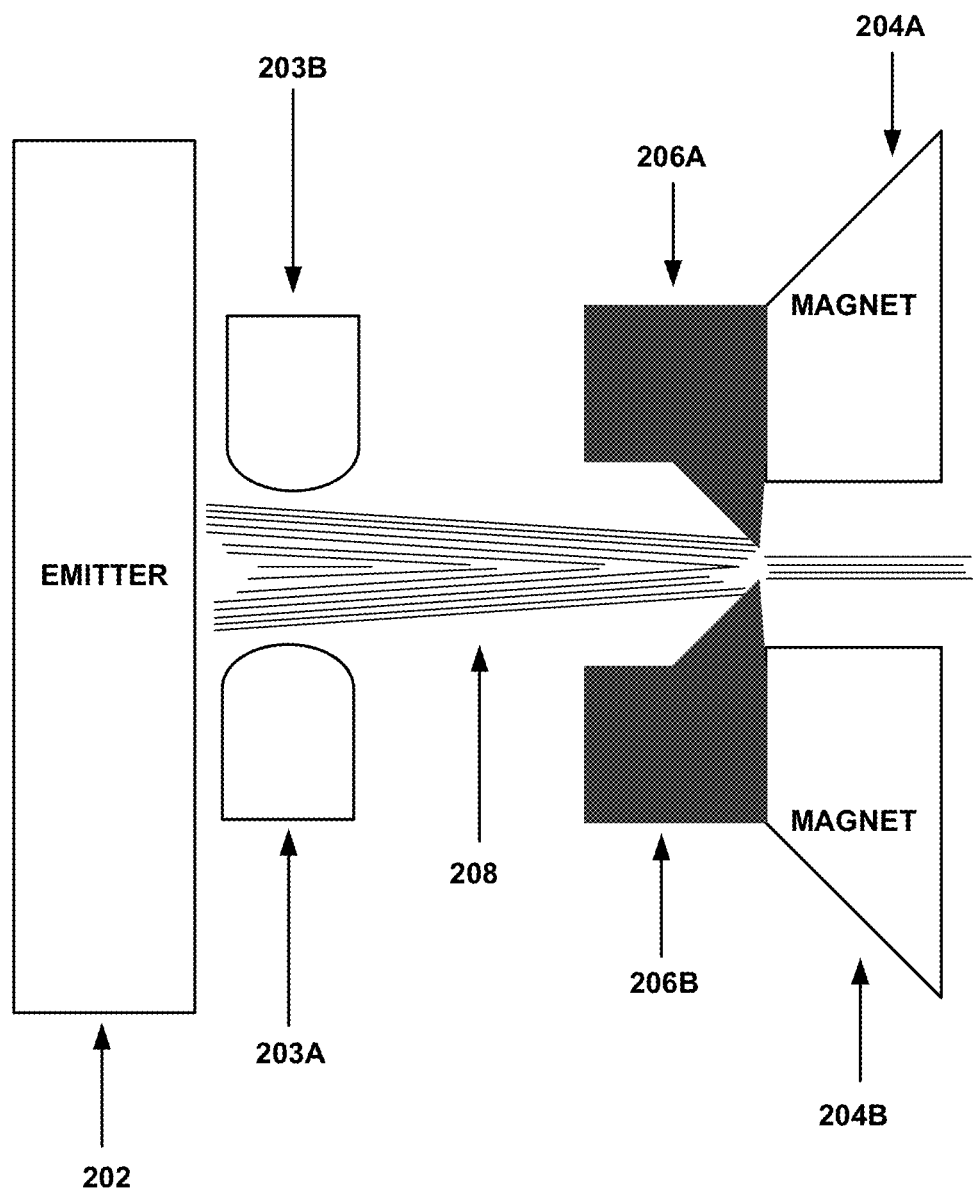
FIG. 2 shows a permanent-magnet particle beam apparatus having an attached non-magnetic metal portion for tunability, in accordance with an embodiment.

FIG. 2 shows permanent-magnet particle beam apparatus having an attached non-magnetic metal portion for tunability, in accordance with an embodiment. In particular, FIG. 2 is a cross-section of an otherwise three dimensional permanent-magnet particle beam apparatus.

It should be noted that while certain components of the permanent-magnet particle beam apparatus are shown, the permanent-magnet particle beam apparatus may also optionally include additional components not shown. Just by way of example, the permanent-magnet particle beam apparatus may typically include a housing and electrical connections which is not shown in FIG. 2, but which is well known in the art. Other additional components, which are optional, are described below. Thus, FIG. 2 should be interpreted as showing all or part of an internal portion of a permanent-magnet particle beam apparatus.

Furthermore, reference is made throughout to a permanent-magnet particle beam apparatus. This refers to an electrical device that is configured to emit a particle beam and to include a set of permanently situated magnets that are utilized for controlling the particle beam. However, the present embodiments described herein also include non-magnetic electrical conductor (e.g. metal) portion for tunability, which is an improvement to similar prior art devices such as that shown in FIG. 1. The permanent-magnet particle beam apparatus may be utilized for numerous applications, including for example, micro-focusing elements for e-beam lithography.

As shown in the present embodiment of FIG. 2, the permanent-magnet particle beam apparatus includes a particle emitter 202 that emits a particle beam 208. The particle beam 208 is comprised of a stream of particles, which may be electrons or other charged particles. The permanent-magnet particle beam apparatus also includes and extractor 203A, 203B, and a set of permanent magnets 204A, 204B forming a magnetic field for controlling the condensing of the particle beam 208.

Further, the permanent-magnet particle beam apparatus includes a non-magnetic metal (or other non-magnetic electrical conductor/semi-conductor material) component 206A, 206B (i.e. electrode) situated with the set of permanent magnets 204A, 204B to control a kinetic energy of the particle beam 208 moving through the magnetic field. This element 206A, 206B controls the kinetic energy of the particle beam 208 in the region of the magnetic lens without affecting the magnetic field distribution. While shown as two portions 206A, 206B in the cross-section view, it should be noted that non-magnetic metal component 206A, 206B may, in one embodiment, be a single component with a channel through which the particle beam 208 travels. For example, the non-magnetic metal component 206A, 206B may be a ring or otherwise cylindrical shaped component of non-magnetic metal material.

The non-magnetic metal component 206A, 206B may be situated with the set of permanent magnets 204A, 204B by being coupled (attached) to or otherwise near the permanent magnets 204A, 204B. In the embodiment shown, the non-magnetic metal component 206A, 206B is coupled to the permanent magnets 204A, 204B. In particular, the non-magnetic metal component 206A, 206B may be coupled to a front side of the permanent magnets 204A, 204B (i.e. the side having an opening at which the particle beam 208 enters). However, another embodiment is contemplated where the non-magnetic metal component 206A, 206B is separated from the set of permanent magnets 204A, 204B, and this is described in detail below with respect to FIG. 3.

To this end, the non-magnetic metal component 206A, 206B may be situated at or near a location where the magnetic field is strongest. However, since the non-magnetic metal component 206A, 206B is a non-magnetic metal material, the non-magnetic metal component 206A, 206B may control the electrostatic potential of the particle beam 208 and thus the kinetic energy of the particle beam 208 moving through the magnetic field without interfering with (altering or degrading) the magnetic field formed by the set of permanent magnets 204A, 204B, in accordance with known scientific properties for non-magnetic metal. It should be noted that the shape of the non-magnetic metal component 206A, 206B can affect an extent to which the kinetic energy of the particle beam 208 in or near the magnetic lens region is controlled. Thus, the non-magnetic metal component 206A, 206B may be manufactured to be of a shape that affects the velocity of the particle beam 208 to an extent desired, thus offering tunability for the permanent-magnet particle beam apparatus.

As shown (as a specific example of a non-magnetic component 206A, 206B with an added purpose of beam aperturing), a first opening of the non-magnetic metal component 206A, 206B that receives the particle beam 208 from the emitter 202 as input can be larger than a second opening of the non-magnetic metal component 206A, 206B through which the particle beam 208 is output. This configuration of the non-magnetic metal component 206A, 206B allows the particle beam 208 to be focused through the non-magnetic metal component 206A, 206B. Of course, this opening configuration of the non-magnetic metal component 206A, 206B is optional, or may be configured with respective opening sizes that provide a desired velocity and beam current of the particle beam 208 at the output.

Figure 3:
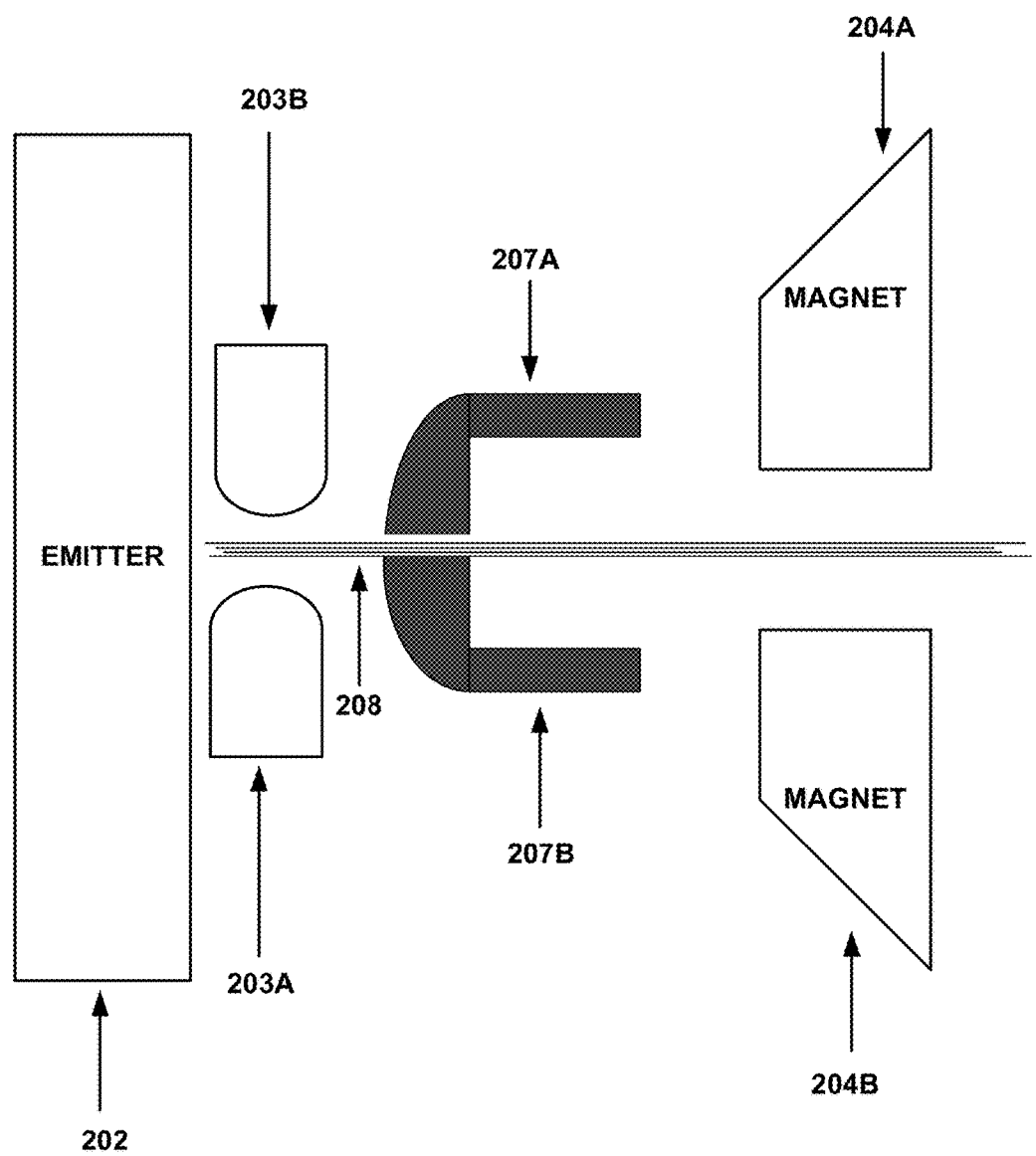
FIG. 3 illustrates a permanent-magnet particle beam apparatus having a non-attached non-magnetic metal portion for tunability, in accordance with an embodiment.

FIG. 3 illustrates a permanent-magnet particle beam apparatus having a non-attached non-magnetic metal portion for tunability, in accordance with an embodiment. The permanent-magnet particle beam apparatus is as described above with respect to FIG. 2, except that instead of the non-magnetic metal component 206A, 206B being electrically connected to the permanent magnets 204A, 204B as shown in FIG. 2, FIG. 3 shows an embodiment where the non-magnetic metal component 207A, 207B is electrically separated from the set of permanent magnets 204A, 204B.

In each of the embodiments described above for FIGS. 2 and 3, an architecture is disclosed that is compatible with miniature-scale devices and high vacuum. The incorporation of the non-magnetic metal component 206A, 206B or 207A, 207B provides control of the electrostatic potential near or at the peak of the magnetic field, which in turn maximizes the ability for beam condensing tunabilty with reduced kinetic energy changes on the permanent magnets 204A, 204B.

In the embodiments shown in FIGS. 2 and 3, the permanent-magnet particle beam apparatus may not necessarily include a separate extractor. This is possible since the non-magnetic metal component 206A, 206B or 207A, 207B at the permanent magnets 204A, 204B can itself provide both the extractor and the beam-limiting aperture as described above, but that function is optional and use-case specific. In addition, the new location of the beam-limiting aperture when provided by the non-magnetic metal component 206A, 206B or 207A, 207B (i.e. at the magnet instead of at the emitter 202 as is otherwise the case when using the extractor) is farther away from the emitter 202 and can be slightly larger-diameter and with a set of relaxed tolerances when compared previous location closer to the particle emitter. This may provide an advantage in manufacturability. Of course, as already described above, this beam-limiting aperture is optional for the non-magnetic metal component 206A, 206B or 207A, 207B.

As an option, however, permanent-magnet particle beam apparatus described above for FIGS. 2 and 3 may also include an extractor (not shown) that is completely separate from the non-magnetic metal component 206A, 206B or 207A, 207B, such that the permanent-magnet particle beam apparatus is designed to separate a tip-extractor vacuum region provided by the extractor from the electrode vacuum provided by a combination of the non-magnetic metal component 206A, 206B or 207A, 207B and the permanent magnets 204A, 204B. In this case, the extractor does not require a long semi-closed bore that represents a trapped volume, as is the case in the prior art as disclosed in FIG. 1. The architecture of FIGS. 2 and 3, with an extractor included, may offer more flexibility in the vacuum architecture and conductance for the entire permanent-magnet particle beam apparatus region because now the extractor is a completely separate electrode and the beam-limiting aperture can reside on the non-magnetic metal component 206A, 206B or 207A, 207B.

In the case where the permanent-magnet particle beam apparatus includes the extractor, reduction of cross-talk between a change of extraction field and condensing may be provided. For example, a change in kinetic energy on the extractor has a weaker effect on the condensing than what was observed in the prior art permanent-magnet particle beam apparatus architecture. This is because in the architecture described for FIGS. 2 and 3 the extractor is not located at the peak region of the magnetic lens field.

Moreover, individual control of condensing may be provided with electrostatic voltage. In the past, a separate electrostatic condensing lens located further downstream had to be added. The individual permanent magnetic lens voltage control and the non-magnetic metal component offer that functionality and with a much lower required tuning voltage range.

The permanent-magnet particle beam apparatus described above for FIGS. 2 and 3 may also enhance manufacturability. The individual non-magnetic metal component 206A, 206B or 207A, 207B can be manufactured, selected and positioned by a precision pick individual selection of beam limiting apertures dimensions. Owing to the small aperture sizes on order of microns the non-magnetic metal component 206A, 206B or 207A, 207B can be "cherry-picked" from the manufacture lot to allow one to match target tolerances and system-to-system uniformity more closely.

Still yet, the permanent-magnet particle beam apparatus described above for FIGS. 2 and 3 may utilize low-power drive electronics. The non-magnetic metal component 206A, 206B or 207A, 207B is controlled by a voltage. Small leakage current plus capacitance are the only impedances of relevance. So in addition to relatively high programming speed no large current to drive a high-inductance coil is needed, as is otherwise the case for electron guns having the architecture described above with respect to FIG. 1. The architectures in FIGS. 2 and 3 need no cooling and can allow for high-speed changes in condensing. The latter could be of value to future charged particle devices.

Figure 1:
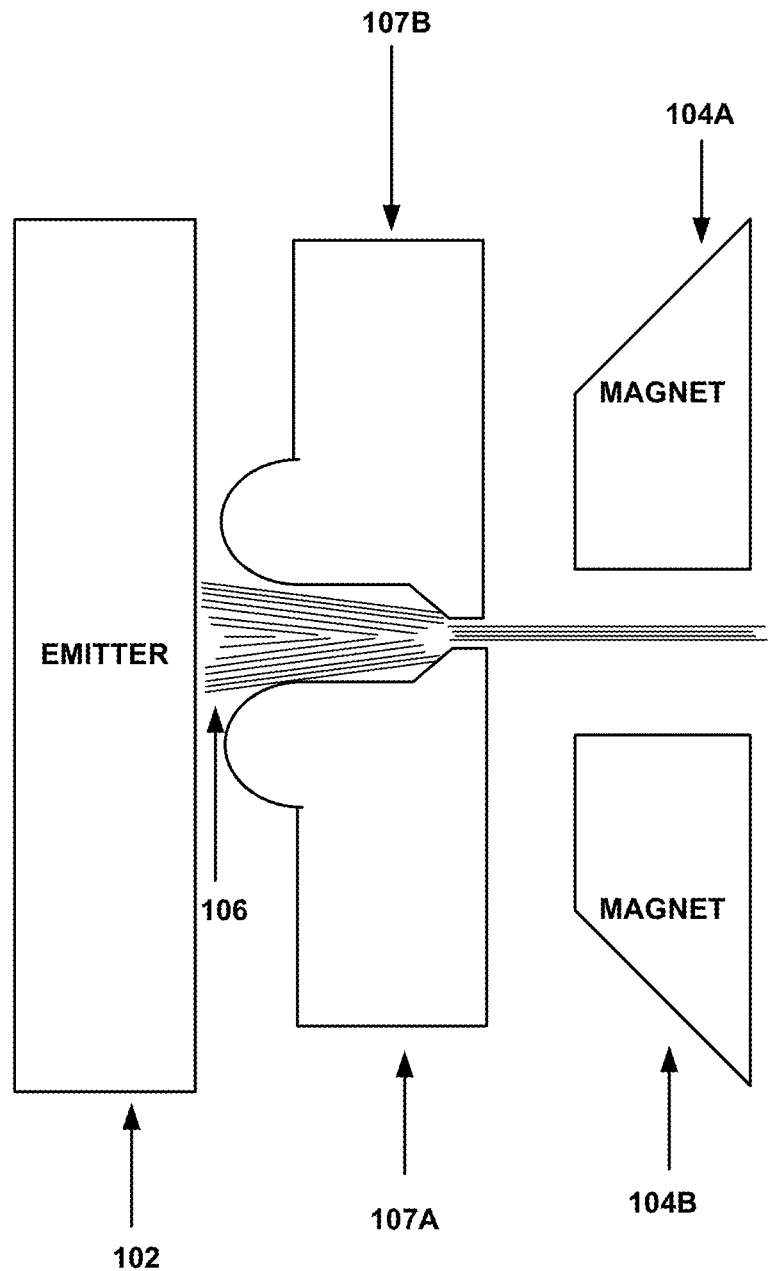
FIG. 1 shows one example of a configuration of a permanent-magnet electron gun having an extractor for control of emission current, in accordance with the prior art.
Figure 4:
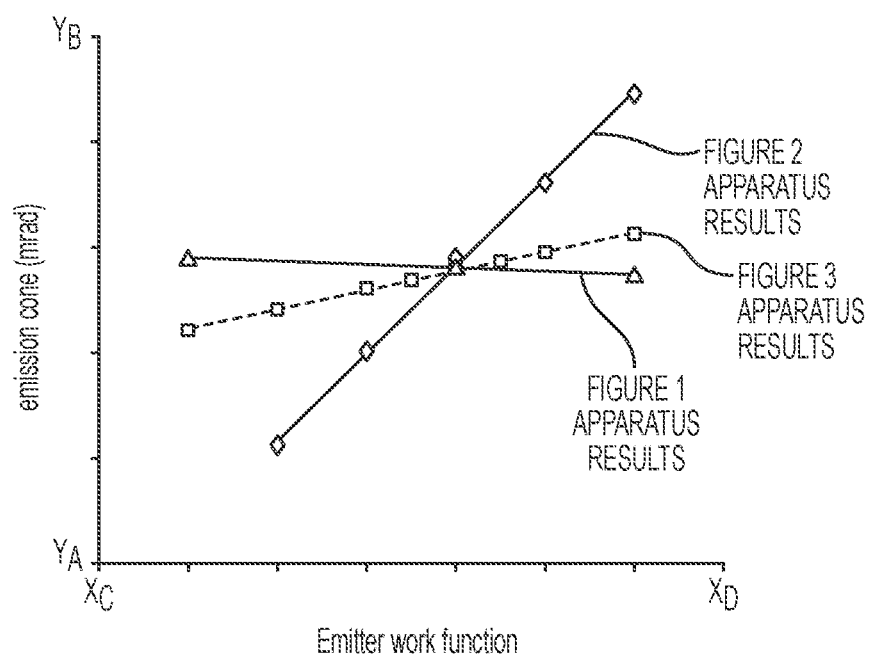
FIG. 4 illustrates an example of the effects of the configurations of FIG. 2 and FIG. 3 with respect to the prior art implementation of FIG. 1.

FIG. 4 illustrates an example of the effects of the configurations of FIG. 2 and FIG. 3 with respect to the prior art implementation of FIG. 1. As shown, the apparatus in FIG. 1 provided beam condensing that was a strong function of the extraction field required to maintain a certain level of emission. Hence, the line on the graph shows the steepest slope (or coupling).

The apparatus in FIG. 2 has about a 5 times smaller slope than that of the slope resulting from the apparatus in FIG. 1. This means that a smaller amount of correction for condensing is required downstream of the apparatus, more tunability at the source is provided, and a larger axial tolerance budget is provided.

The apparatus in FIG. 3, as shown in the graph, allows for full control of emission and condensing so as to eliminate the need of an additional condenser lens situated downstream of the apparatus.

Figure 5:
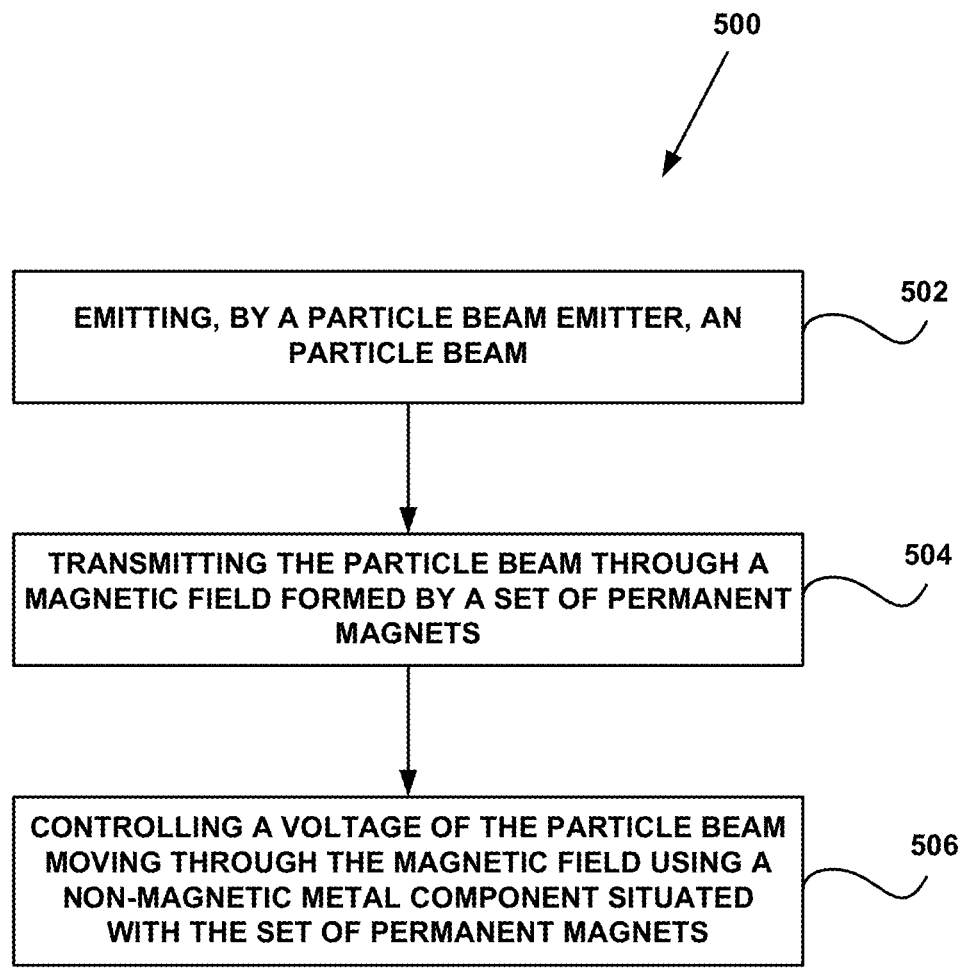
FIG. 5 shows controlling a particle beam through a permanent-magnet particle beam apparatus, in accordance with an embodiment.

FIG. 5 illustrates a method 500 controlling a particle beam through a permanent-magnet particle beam apparatus. The method 500 includes in operation 502 emitting, by a particle beam emitter, a charged particle beam. Then in operation 504, the charged particle beam is transmitted through a magnetic field formed by a set of permanent magnets for controlling condensing of the charged particle beam. Further, in operation 506, a kinetic energy of the charged particle beam moving through the magnetic field is controlled using a non-magnetic electrical conductor component situated with the set of permanent magnets.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A permanent-magnet particle beam apparatus, comprising:
   charged particle beam emitter that emits a charged particle beam;
   a non-magnetic electrical conductor component with a channel through which the charged particle beam travels, the non-magnetic electrical conductor component controlling kinetic energy of the charged particle beam; and
   a set of permanent magnets forming a magnetic field for controlling condensing of the charged particle beam, the set of permanent magnets having an input opening facing an output opening of the non-magnetic electrical conductor component, such that the charged particle beam enters the magnetic field at the input opening of the set of permanent magnets from the output opening of the non-magnetic electrical conductor component, for being condensed.

2. The permanent-magnet particle beam apparatus of claim 1, wherein the charged particle beam is an electron beam.

3. The permanent-magnet particle beam apparatus of claim 1, wherein the non-magnetic electrical conductor component is electrically coupled to the set of permanent magnets on a front side of the set of permanent magnets having the opening.

4. The permanent-magnet particle beam apparatus of claim 1, wherein the non-magnetic electrical conductor component is electrically separated from the set of permanent magnets.

5. The permanent-magnet particle beam apparatus of claim 1, wherein the non-magnetic electrical conductor component is situated at a location where the magnetic field is strongest.

6. The permanent-magnet particle beam apparatus of claim 1, wherein the non-magnetic electrical conductor component is metal.

7. The permanent-magnet particle beam apparatus of claim 1, wherein an input opening of the non-magnetic electrical conductor component that receives the charged particle beam from the charged particle beam emitter as input is larger than the output opening of the non-magnetic electrical conductor component through which the charged particle beam is output to the input opening of the set of permanent magnets, such that the charged particle beam is focused through the non-magnetic metal component.

8. The permanent-magnet particle beam apparatus of claim 1, wherein a shape of the non-magnetic electrical conductor component affects an extent to which the kinetic energy of the charged particle beam is controlled.

9. The permanent-magnet particle beam apparatus of claim 1, wherein the non-magnetic electrical conductor component is comprised of a non-magnetic metal material to control the kinetic energy of the charged particle beam without altering the magnetic field formed by the set of permanent magnets.

10. A method for controlling a particle beam through a permanent-magnet particle beam apparatus, comprising:
    emitting, by a charged particle beam emitter, a charged particle beam;

transmitting the charged particle beam through a channel of non-magnetic electrical conductor component to control a kinetic energy of the charged particle beam; and receiving, at an input opening of a set of permanent magnets facing an output opening of the non-magnetic electrical conductor component, the charged particle beam output from the non-magnetic electrical conductor component;

transmitting the charged particle beam through a magnetic field formed by the set of permanent magnets for controlling condensing of the charged particle beam.

11. The method of claim 10, wherein the charged particle beam is an electron beam.

12. The method of claim 10, wherein the non-magnetic electrical conductor component is electrically coupled to the set of permanent magnets on a front side of the set of permanent magnets having the opening.

13. The method of claim 10, wherein the non-magnetic electrical conductor component is electrically separated from the set of permanent magnets.

14. The method of claim 10, wherein the non-magnetic electrical conductor component is situated at a location where the magnetic field is strongest.

15. The method of claim 10, wherein the non-magnetic electrical conductor component is situated near a location where the magnetic field is strongest.

16. The method of claim 10, wherein the charged particle beam is received from the charged particle beam emitter as input at an input opening of the non-magnetic electrical conductor component and is output through an output opening of the non-magnetic electrical conductor to the input opening of the set of permanent magnets, and wherein the input opening is larger than the output opening such that the charged particle beam is focused through the non-magnetic metal component.

17. The method of claim 10, wherein an extent to which the kinetic energy of the charged particle beam is controlled is based on a shape of the non-magnetic electrical conductor component.

18. The method of claim 10, wherein the non-magnetic electrical conductor component is comprised of a non-magnetic metal material to control the kinetic energy of the charged particle beam without altering the magnetic field formed by the set of permanent magnets.

* * * * *